(12) United States Patent
Kumar et al.

(10) Patent No.: US 8,476,768 B2
(45) Date of Patent: Jul. 2, 2013

(54) SYSTEM ON A CHIP WITH INTERLEAVED SETS OF PADS

(75) Inventors: Ajay Kumar, Darapur Tanda Urmar Hoshiapur (IN); Sahil S. Dabare, Noida (IN); Ajay K. Gaite, Najafgarh (IN); Shyam S. Gupta, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/170,210

(22) Filed: Jun. 28, 2011

(65) Prior Publication Data

US 2013/0001790 A1 Jan. 3, 2013

(51) Int. Cl.
*H01H 79/00* (2006.01)

(52) U.S. Cl.
USPC ............ 257/773; 710/305; 710/317; 438/618

(58) Field of Classification Search
USPC .......................................... 257/773
See application file for complete search history.

(56) References Cited

U.S. PATENT DOCUMENTS

| | | | |
|---|---|---|---|
| 5,928,371 A | 7/1999 | Robinson | |
| 6,262,594 B1 * | 7/2001 | Cheung et al. | 326/38 |
| 6,634,009 B1 | 10/2003 | Molson | |
| 7,977,790 B2 * | 7/2011 | Nagai | 257/737 |
| 2001/0002449 A1 * | 5/2001 | Eisenmann et al. | 701/1 |
| 2006/0161743 A1 * | 7/2006 | Fekih-Romdhane et al. | 711/154 |
| 2008/0164907 A1 * | 7/2008 | Mercaldi-Kim et al. | 326/41 |
| 2008/0304352 A1 | 12/2008 | Chen | |
| 2009/0212406 A1 * | 8/2009 | Nagai | 257/678 |

* cited by examiner

*Primary Examiner* — Chuong A Luu
*Assistant Examiner* — Jaehwan Oh
(74) *Attorney, Agent, or Firm* — Charles Bergere

(57) ABSTRACT

A system on a chip (SOC) includes a physical interface having first and second sets of interface pads. Interface pads from the first set are interleaved with interface pads from the second set. Additionally, the SOC is arranged for operation with a superset die having first and second personalities and has a physical interface with interface pads. The SOC uses a first number of interface pads in the first personality and a second number of interface pads in the second personality, where the first number is greater than the second number. A switch switches signals between the superset die and the physical interface and, in the second personality, switches signals to the physical interface so that interface pads in the second number of interface pads are interleaved with interface pads not in use in the second personality.

9 Claims, 4 Drawing Sheets

SYSTEM ON A CHIP WITH INTERLEAVED SETS OF PADS

BACKGROUND OF THE INVENTION

The present invention relates to a system on a chip (SOC) and, more particularly, to a SOC having a physical interface, such as a DDR interface, and where the SOC is arranged for operation with a superset die having multiple personalities.

SOCs typically include multiple separate logic blocks. Some versions (personalities) of the SOC use all of the logic blocks while other personalities may have one or more blocks disabled or operating at different parameters such as with a slower clock frequency or with narrower or wider busses.

There is an industry-wide drive to reduce design costs for SOC architectures. One area of investigation relates to reduction of the costs relating to the packaging of the SOC die. One way to achieve this is to develop engineering and design techniques allowing improved flexibility, which can be implemented across a broad range of products. Previous efforts have seen a re-ordering of the ball map of the chip along with pad ordering on the die. For instance, one known technique relates to ordering a DDR pad sequence to make the SOC more routing friendly from a board routing perspective. At least two different preferred trace sequences on printed circuit boards for at least one memory device are provided in this technique. A memory controller having a core logic circuit, a plurality of input/output devices and a re-orderer then is provided. The core logic circuit has I/O terminals and each I/O device has a pad. The re-orderer is coupled between the core logic circuit and the I/O devices, and is programmable to selectively connect the input/output devices to the I/O terminals. For example, the re-orderer is programmed to selectively connect a portion of the I/O devices to the I/O terminals such that one of the different preferred trace sequences is substantially supported.

Another area of investigation for cost reduction relates to being able to derive multiple SOCs of high complexity from a single die. To have such flexibility would provide a significant advantage; it would enable the product designer to provide cost-effective solutions depending on varied customer needs. A major challenge in driving the layout for smaller SOCs comes from the physical interface layout such as for large pin count parallel interfaces like the DDR interface.

For a 64-bit physical interface, such as the DDR interface, the traditional method of ordering pads is to keep signals of each byte lane together. The pad order of a typical 64-bit DDR interface is shown in FIG. 1. In FIG. 1, a DDR interface 100 comprises interface pads for a number of byte lanes 102*a*, 102*b*, 102*c*, . . . 102*h*. The interface pads 104*a*, 104*b*, 104*c*, . . . 104*h* are, therefore, grouped in groups of eight. For example, the interface pads 104*a* for byte lane 102*a* are pads DQ0 to DQ7. The DDR interface 100 also comprises an address/control section 106 for bits 108.

The pads in byte lanes 0 to byte lane 3 routed through the left-hand side of the DDR interface 100 (being to the left-hand side of the address/control pads 106, 108), form a first logical group 110 and the pads in byte lanes 4 to byte lane 7 routed through the right-hand side of the DDR interface 100 (being to the right-hand side of the address/control pads 16. 108) form a second logical group 112.

Now, if the same die is to be repackaged in a smaller package, with, for example, a 32-bit DDR interface SOC, and only half of the interface pads of the DDR physical interface 100 are required, then several options are available for the repackaging. These options include: (1) to bond out byte lanes 0 to 3 (102*a*-102*d*) only; (2) to bond out byte lanes 4 to 7 (102*e*-102*h*) only; (3) to bond out byte lanes 102*c*, 102*d*, 102*e* and 102*f* only; and (4) to bond out byte lanes 102*a*, 102*b*, 102*g* and 102*h* only. As used herein, the term "bond out" means to physically connect with bond wires with a wire bonding process.

These solutions are not without their own problems. For instance, one problem with options (1) and (2) arises at the time of package routing. Bonding out four adjacent byte lanes, and only those four, on one side of the DDR interface 100 may cause significant routing congestion in the corresponding half of the package. This, in turn, can lead to a reduction in signal integrity performance. Similar issues are expected to be encountered for option (3).

So, from these known options, option (4) would seem to be the best choice. This approach is more routing friendly when compared to options (1) to (3), but fresh problems are encountered. If bonding out byte lanes 102*a*, 102*b*, 102*g* and 102*h*, this means that four byte lanes 102*c*, 102*d*, 102*e* and 102*f* in the centre region of the DDR interface 100 are left unbonded. As used herein, "unbonded" means not physically connected such as with bond wires. This means that voids are created in that area of the SOC because there are few or no bond wires in those areas. Thus, during a molding process, the flow of mold compound in these voids can cause wire sweep issues, resulting in wire cross-over and shorting. Therefore, to obviate such problems, it is preferable to avoid large voids between wire groups in the SOC.

Thus, it would be advantageous to have a SOC with a physical interface and/or pad ordering method that alleviates the aforementioned problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

Figure 1:
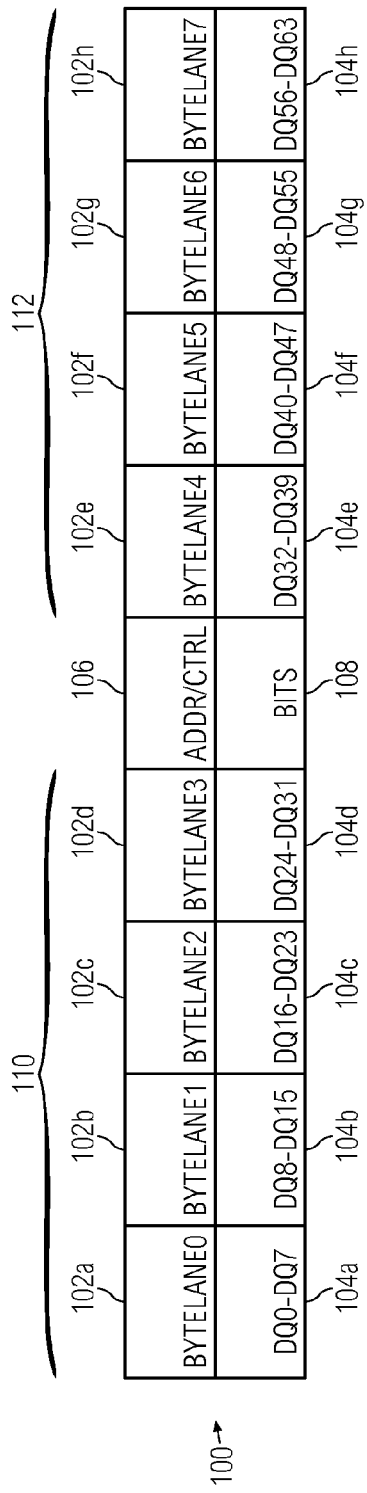
FIG. 1 is a schematic block diagram illustrating the layout of a conventional SOC physical interface.

In one embodiment the present invention provides a system on chip (SOC) comprising a physical interface having a first set of interface pads and a second set of interface pads, wherein interface pads from the first set of interface pads are interleaved with interface pads from the second set of interface pads.

In another embodiment of the present invention, there is provided a method of forming a SOC, the method comprising: providing a physical interface having a first set of interface pads and a second set of interface pads; and interleaving interface pads from the first set of interface pads with interface pads from the second set of interface pads.

In another embodiment of the present invention, a SOC for operation with a superset die having first and second personalities is provided, the SOC comprising: a physical interface having interface pads, wherein the SOC is arranged for operation with the first personality using a first number of the interface pads and for operation with the second personality using a second number of the interface pads, the first number being greater than the second number; and a switch arranged to switch signals between the superset die and the physical interface, and, in the second personality, to switch signals to the physical interface so that interface pads in the second number of interface pads are interleaved with interface pads not in use in the second personality.

Also disclosed is a method of forming a SOC, the SOC comprising a superset die having first and second personalities. The method comprises providing a physical interface having interface pads, and arranging the SOC for operation with the first personality using a first number of the interface pads and for operation with the second personality using a second number of the interface pads, the first number being greater than the second number. The method also comprises providing a switch for switching signals between the superset die and the physical interface wherein, in the second personality, the switch can switch signals to the physical interface so that interface pads in the second number of interface pads are interleaved with interface pads not in use in the second personality.

Embodiments of the invention may provide significant technical benefits in comparison with conventional techniques. For example, provision of a SOC where interface pads from a first set of interface pads are interleaved with interface pads from a second set of interface pads allows different sets of signals to be bonded out from the die to the package to create multiple SOC arrangements for different packages and different packaging requirements while avoiding issues like wire sweep. Embodiments of the invention provide techniques for achieving different bus widths in different SOC personalities using a superset die and the same physical interface with a more evenly distributed wire density and allows for improved handling of timing-critical interfaces like DDR interfaces without adding an extra level of multiplexing. As used herein, superset die refers to a semiconductor die that may be provided in various versions/personalities such as wider or narrower busses, while SOC refers to the packaged device (i.e., the packaged die)

The present invention thus provides a pad ordering strategy. Instead of grouping SOC signals byte-lane wise, byte lanes, or more specifically, pads from different byte lanes, are interleaved. That is, signals/pads from one byte lane are interleaved with signals/pads from another byte lane. For example, byte lane 0 signals can be interleaved with signals from byte lane 4, signals from byte lane 1 can be interleaved with signals from byte lane 5, and so on. In embodiments of the invention, alternate pads may be from the same byte lane.

Interleaving the signals in the described manner helps, principally, in at least the following two ways.

In the first instance, the space created by reducing the functional signals may be evenly distributed around the die and the SOC package. This allows for better utilization of the real estate available on the SOC package substrate thereby facilitating easy and efficient substrate (printed circuit board) routing in a smaller package. An uneven distribution of signals can lead to poor routing, which can lead to reduced electrical performance.

In the second instance, the even redistribution of the bond wires prevents the formation of large voids in the bond wiring, which avoids wire sweep problems caused by unobstructed flow of mold compound.

As also noted above, an embodiment of the invention provides for a SOC arranged for operation with a superset die in both a first personality and a second personality, the SOC comprising a physical interface having interface pads. A switch such as a multiplexer is arranged to switch signals between the superset die and the physical interface and, in the second personality, to switch signals to the physical interface so that interface pads in the second number of interface pads are interleaved with interface pads not in use in the second personality, further significant benefits may be realized. For instance, such an approach allows functional signals to be re-distributed, such as equally on all sides of the die.

Embodiments of the invention allow derivation of multiple SOCs of high complexity from a single master or "superset" die.

The terms "a" or "an," as used herein, are defined as one or more than one. Also, any use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to distinguish between the elements such terms describe. Thus, these terms are not necessarily intended to indicate temporal or other prioritization of such elements.

The present invention is, for the most part, composed of materials and components known to those skilled in the art. Therefore full details will not be explained in any greater extent than that considered necessary for the understanding and appreciation of the underlying concepts of the present invention and in order not to obfuscate or distract from the teachings of the present invention.

Some of the embodiments may be implemented using a variety of different arrangements. For example, although FIG. 2 and the discussion thereof describe a SOC having a physical interface, this exemplary SOC is presented merely to provide a useful reference in discussing various aspects of the invention. Of course, the description of the SOC has been simplified for purposes of discussion, and many different types of appropriate SOC may be used in accordance with the invention. Those skilled in the art will recognize that disclosed SOCs are merely illustrative and that the invention may encompass alternative embodiments or may impose an alternate composition of components or materials.

Further, those skilled in the art will recognize alternative embodiments may include multiple instances of a particular operation, and the order of operations may be altered in various other embodiments.

Figure 2:
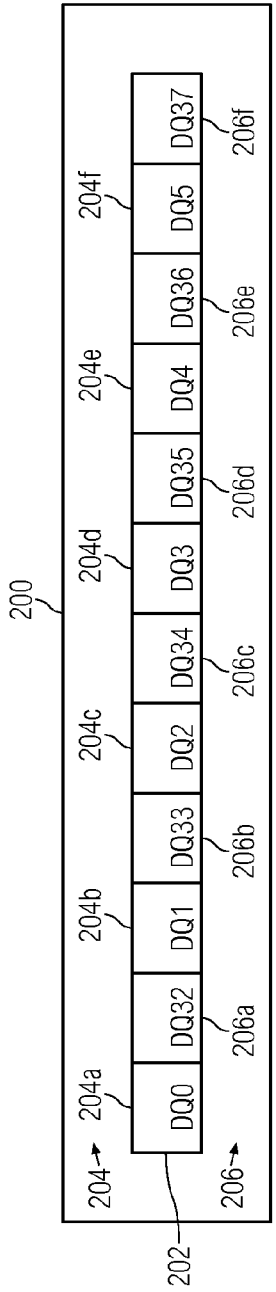
FIG. 2 is a schematic block diagram illustrating a SOC having a physical interface in accordance with an embodiment of the present invention.

Referring now to FIG. 2, a first embodiment of the present invention is illustrated. FIG. 2 illustrates a SOC 200 that has multiple other components omitted from the figure for the sake of clarity. What is illustrated is a physical interface 202 comprising first interface pads 204*a*, 204*b*, 204*c*, 204*d*, 204*e*, and 204*f* comprising, collectively, a first set 204 of interface pads. The physical interface 202 also comprises second interface pads 206*a*, 206*b*, 206*c*, 206*d*, 206*e* and 206*f* comprising, collectively, a second set 206 of interface pads. It will be appreciated that the number of interface pads in each set are illustrative only and that fewer or more pads may be provided. The pads of the first and second sets 204, 206 are interleaved. Further, it will be appreciated that FIG. 2 illustrates the SOC 200 formed by a method comprising providing a physical interface 202 having a first set 204 of interface pads and a second set 206 of interface pads. The method further comprises interleaving interface pads from the first set 204 with interface pads from the second set 206.

Unless otherwise stated, it will be appreciated that interleaving of the pads does not necessarily mean that pads from one set of interface pads are disposed immediately adjacent pads from another set of interface pads. It is possible that other pads may be disposed therebetween. However, in the embodiment of FIG. 2, the interleaving of the pads is a physical interleaving so that an interface pad from the first set 204 is disposed between and adjacent to two interface pads from the second set 206. For example, interface pad 206a from the second set 206 is disposed between and adjacent to interface pads 204a and 204b from the first set 204 of interface pads.

It will also be appreciated that the interleaving may be provided in the SOC 200 including in areas other than the physical interface, such as in the routing of electrical connections between components of the SOC.

As noted above, the SOC 200 may have other components that are not illustrated in the figure including, but not limited to, a microcontroller, microprocessor or DSP core, memory block, timing source, peripherals, other external interfaces, analog interfaces and voltage regulators/power management circuits.

As illustrated in FIG. 2, the pad 204a (DQ0) is from byte lane 0 and pad 206a (DQ32) is from byte lane 4. The remaining pads in the sets 204 and 206 are also, respectively, from byte lane 0 and byte lane 4. Thus, the first set 204 of interface pads comprises interface pads for a first byte lane of the SOC 200 and the second set 206 of interface pads comprises interface pads for a second byte lane of the SOC 200.

It will also be appreciated that, in embodiments of the invention, pads from any byte lane can be interleaved with pads from any other byte lane. However, it may be advantageous where the first byte lane is from a first logical group (e.g., group 110) of byte lanes and the second byte lane is from a second logical group (e.g., group 112) of byte lanes. For example, the first byte lane being a byte lane such as byte lane 0 which would normally be routed through the left hand side (first logical group) of a DDR interface and the second byte lane being byte lane 4 would normally be routed to the right hand side of a DDR interface. Interleaving pads from different logical groups allows for a relatively even distribution of bond wires when bonding out the interface 202 for smaller interfaces, such as a 32-bit DDR. However, it is not necessary for the interleaving to be of pads from different logical groups. Alternatively, acceptable results may be achieved by interleaving pads from, for example, byte lane 0 with pads from, for example, byte lane 4. And going back to another exemplary embodiment where interleaving is between pads from byte lanes in different logical groups of byte lanes, the techniques herein described are equally applicable for interleaving, for example, pads from byte lane 0 with pads from any of byte lane 5, byte lane 6 or byte lane 7.

In the embodiment of FIG. 2, alternate interface pads in the interface are from a particular byte lane. That is, pads 204a and 204b are from the same byte lane, in this example byte lane 0. The same could be said for alternate pad pairs 204b/204c, 204c/204d, 206a/206b, which are also from byte lane 0. Pads 206a and 206b, routed as alternate pads in the interface 202, are also from a particular byte lane, byte lane 4.

Figure 3:
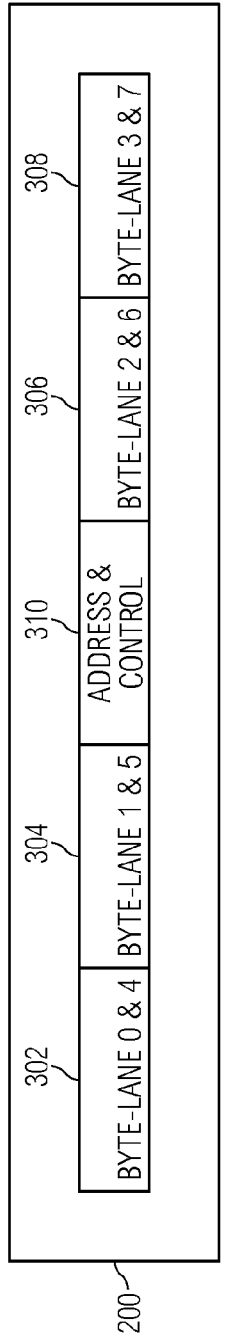
FIG. 3 is a schematic block diagram illustrating the overall pad order of the SOC and physical interface of the embodiment of FIG. 2.

The overall pad order and interleaving in the embodiment of FIG. 2 is represented logically in FIG. 3. The SOC 200 comprises a first byte lane pairing 302 (where pads from byte lane 0 are interleaved with pads from byte lane 4), second byte lane pairing 304 (where pads from byte lane 1 are interleaved with pads from byte lane 5), third byte lane pairing 306 (where pads from byte lane 2 are interleaved with pads from byte lane 6) and fourth byte lane pairing 308 (where pads from byte lane 3 are interleaved with pads from byte lane 7). The physical interface of FIG. 3 also has interface pads 310 for address and control bits.

As noted, byte lane pairing 302 comprises pads interleaved with one another from byte lanes 0 and 4, each of which is from different logical groups 110, 112. In the example of FIG. 2 and FIG. 3, the proposed interleaving is that of byte lane 0 with byte lane 4; byte lane 1 with byte lane 5; byte lane 2 with byte lane 6; and byte lane 3 with byte lane 7. However, any pairing of byte lanes may be effected. And indeed, any pairing of byte lanes between different logical groups may also be effected. For example, any byte lane in the left-hand side of the physical interface may be paired with a byte lane from the right-hand side of the interface.

An important aspect of the implementation is to plan the pin-mux layout and floor plan of a superset die in such a way that it allows a reduction of the number of functional signals on all sides of the die thus allowing derivative products to be case in lower-cost lower pin-count packages. Beneficially, the pin-muxing plan may be planned in a way that the signal count is reduced symmetrically from all sides of the die.

Figure 4:
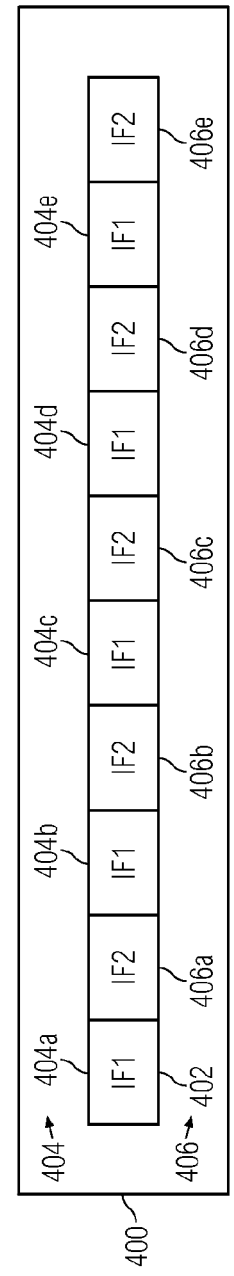
FIG. 4 is a schematic block diagram illustrating the pad order of a SOC and physical interface in accordance with another embodiment of the present invention.

Another embodiment of the invention is illustrated in FIG. 4. The techniques relating to this embodiment may be used in all types of SOC interfaces, but are particularly applicable for small count interfaces such as UART, SPI, USB etc. The embodiment of FIG. 4 implements another type of interleaving, in this embodiment also physical interleaving, which can be used alternatively or additionally to the techniques described with reference to FIGS. 2 and 3. As illustrated, an SOC 400 comprises a physical interface 402 having interface pads 404a, 404b, 404c, 404d and 404e, collectively referred to by 404. The physical interface 402 also comprises interface pads 406a, 406b, 406c, 406d and 406e, collectively referred to by 406. In a first personality of the die (not illustrated in FIG. 4), the interface pads in the first and second sets 404 and 406 are used. In a second personality of the die, only interface pads in the set 404 are used; that is, in the second personality interface pads in set 406 are not used. Thus, the interface pads 404 comprise a first set of interface pads and the interface pads 406 comprise a second set of interface pads. As illustrated, interface pads from the first set 404 of interface pads are interleaved with interface pads from the second set 406 of interface pads.

The first set 404 of interface pads is used in one personality of the superset die (not illustrated in FIG. 4). (Actually, the set 404 of interface pads may be used in more than one personality of the die. In embodiments of the invention, the set 404 of interface pads may be common to all personalities of the superset die; that is, the set 404 of interface pads may be used in all personalities of the superset die.) The set 406 of interface pads is not required in a second personality for the superset die. In embodiments of the invention, the second set 406 of interface pads may be used in more than one personality but, typically, will not be required across all personalities, being used in only a subset of those personalities that use the set 404 of interface pads. That is, in embodiments of the invention where the set 404 of interface pads are used in all personalities, pads in the set 404 will be bonded out. In the subset of personalities, the second set 406 of interface pads will be left unbonded; that is, the interface pads in the second set 406 are not used or required in the second personality (or other personalities).

Figure 5A:
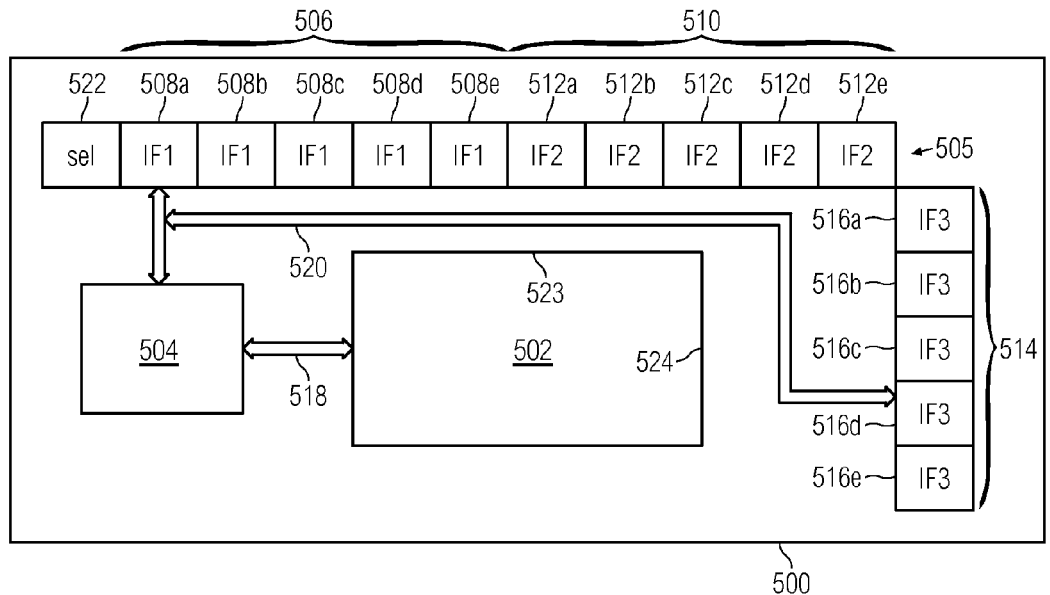
FIG. 5A is a schematic block diagram illustrating a SOC and physical interface in accordance with another embodiment of the present invention in a first personality.
Figure 5B:
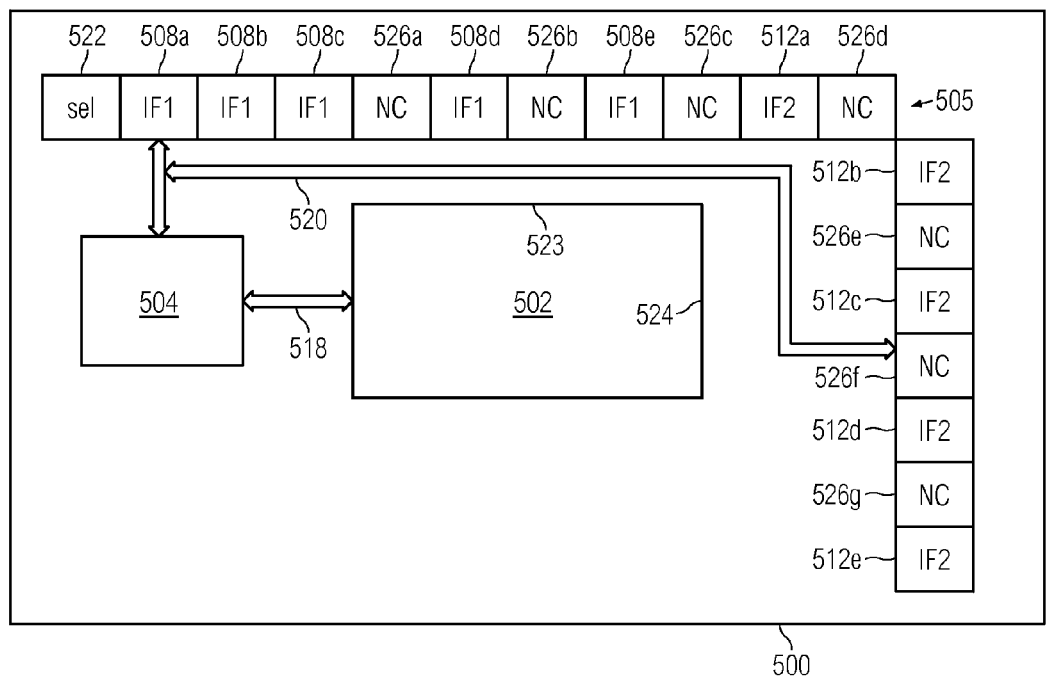
FIG. 5B is a schematic block diagram illustrating the SOC and physical interface of FIG. 5A in a second personality.

FIG. 5 (FIGS. 5A and 5B) illustrates another embodiment of the invention, also implementing interleaving of interface pads, this time a logical interleaving. That is, interleaving of terminal pads is effected via switching, in this case using a multiplexer. The techniques relating to the embodiment of FIG. 5 may be used in addition, or as an alternative, to the techniques relating to the embodiments of FIGS. 2 to 4. In the embodiment of FIG. 5, a level of switching is implemented. FIG. 5A shows a SOC 500 that comprises a superset die 502 operably connected to a switch 504. In this embodiment, the switch 504 comprises a multiplexer. The SOC 500 also comprises a physical interface 505 having a first group or section 506 of interface pads 508a, 508b, 508c, 508d, 508e, a second group or section 510 of interface pads 512a, 512b, 512c, 512d, 512e, and a third group or section 514 of interface pads 516a, 516b, 516c, 516d, 516e. The superset die 502 is electrically connected to the switch 504, schematically represented by bus connection 518. The switch 504 is electrically connected to the physical interface schematically represented by the bus connection 520.

The physical interface 505 also has an interface pad 522 for selecting or designating a personality of the superset die 502. This is a select bit that is used to determine I/O order. The interface pad 522 is tied to 0 in a first personality and is shorted to 1 in a second personality to cause re-routing of at least some electrical signals required in the second personality.

The interface pads of the first, second and third sections 506, 510, 514 are required in at least the first personality of the superset die 502. As with the embodiment of FIG. 4, it may be that the interface pads in the first and second sections 506, 510 are required in more than one personality such as in all personalities of the superset die 502. In at least one personality, e.g., the second personality, interface pads 516 in the third section 514 are not required.

Given that the interface pads in the first and second sections 506, 510 are located proximal to and/or facing a first edge or side 523 of the superset die 502, and that the interface pads in the third section 514 are located proximal to and/or facing a second edge or side 524 of the superset die 502, distinct from the first edge 522, the embodiment of FIG. 5 provides a solution for efficient and flexible rerouting of signals required in the second personality to obtain a more even distribution of bond wires when the die 502 for the second personality is packaged, which is illustrated in FIG. 5B.

In the second personality, signals that were routed to the first and second sections 506, 510 of interface pads in the first personality illustrated in FIG. 5A are now re-routed to different interface pads. Taking, for example, an electrical signal which, in the first personality, is routed to the interface pad denoted 508e of the first section 506 of the physical interface 505 then, in the second personality illustrated in FIG. 5B, this electrical signal is re-routed to an interface pad in the second section 510, where the interface pad is denoted in FIG. 5B as 508e to illustrate the re-routing. Likewise, and citing just one further example, the electrical signal that was routed to the interface pad denoted 512c in the second section 510 of interface pads in the first personality illustrated in FIG. 5A is now re-routed to an interface pad in the third section 514 of the physical interface, as illustrated in FIG. 5B.

It is not necessary to re-route all signals used in the second personality. In the embodiment of FIG. 5B, the signals routed to the interface pads 508a, 508b, 508c in FIG. 5A are not re-routed.

Where signals are re-routed, they are re-routed in a manner such that they are routed to interface pads that are interleaved with interface pads not used in the second personality. Referring to FIG. 5B, interface pads 526a, 526b, 526c, 526e, 526f, 526g are not used in the second personality and are not bonded out when packaged, as denoted by "NC", which means no connect. The electrical signal routed to the interface pad denoted 512c is re-routed in the second personality to be interleaved with two unbonded interface pads 524e, 524f. Therefore, in this embodiment, alternate signals from the first section 506 of the physical interface 505 are multiplexed onto interface pads in the second section 510 of the physical interface 505. Alternate signals from the second section 510 of the physical interface 505 are multiplexed on to interface pads in the third section 514 of the physical interface. Of course, it would also be possible to multiplex signals from the first section 506 to, for example, the third section 514.

Thus it will be appreciated that FIGS. 5A and 5B illustrate a SOC 500 arranged to accommodate a superset die 502 having both a first personality and a second personality. The SOC 500 comprises a physical interface 505 having interface pads. The SOC 500 is arranged for operation in the first personality using a first number 508, 512, 516 of the interface pads and for operation in the second personality using a second number 508, 512 of the interface pads, the first number being greater than the second number. A switch 504 is arranged to switch signals between the superset die 502 and the physical interface 505, and, in the second personality, to switch signals to the physical interface 505 so that interface pads 508, 512 in the second number of interface pads are interleaved with NC interface pads 526 not in use in the second personality.

In the embodiments of FIGS. 5A and 5B, an interface pad (for example, interface pad 512c) is disposed between, and adjacent to, two interface pads 526e, 526f not used in the second personality.

It will also be appreciated that in the embodiments of FIGS. 5A and 5B, the second number of the interface pads is a subset of the first number of the interface pads.

As mentioned above, the techniques described with reference to FIG. 5 can be used as an alternative to or in conjunction with the techniques described with reference to any of FIGS. 2 to 4. When used in addition to any of the embodiments of FIGS. 2 to 4, the physical interface 505 can be considered to be a second physical interface in which case the SOC 500 is arranged for operation with the superset die 502 having both a first personality and a second personality, the SOC 500 further comprising: a physical interface 505 having a third set of interface pads, wherein the SOC 500 is arranged for operation in the first personality using a first number 508, 512, 516 of the third set of interface pads and for operation in the second personality using a second number 508, 512 of the third set of interface pads, the first number being greater than the second number; and a switch 504 arranged to switch signals between the superset die 502 and the physical interface 505, and, in the second personality, to switch signals to the physical interface 505 so that interface pads 508, 512 in the second number of interface pads are interleaved with interface pads 526 not in use in the second personality.

The described techniques allow the package designer to redistribute the functional signals across different sides of the superset die 502. In at least one embodiment, the functional signals are redistributed equally on all sides of the superset die 502. This ensures optimized used of the layout of real estate on all sides of the die 502 to achieve good performance even on a package of reduced size. For example, if the first personality requires a total of 400 functional signals to be substantially evenly distributed across four sides of the die 502 so that there are, say, 100 signals per side. For a different (i.e., second) personality of the die 502 requiring only 300 signals then the functional signals are reduced on all sides of the die so there is a reduction of 25 signals on each side of the die. Therefore, there would be a reduction in 25 bond wires on each side of the die.

Figure 6A:
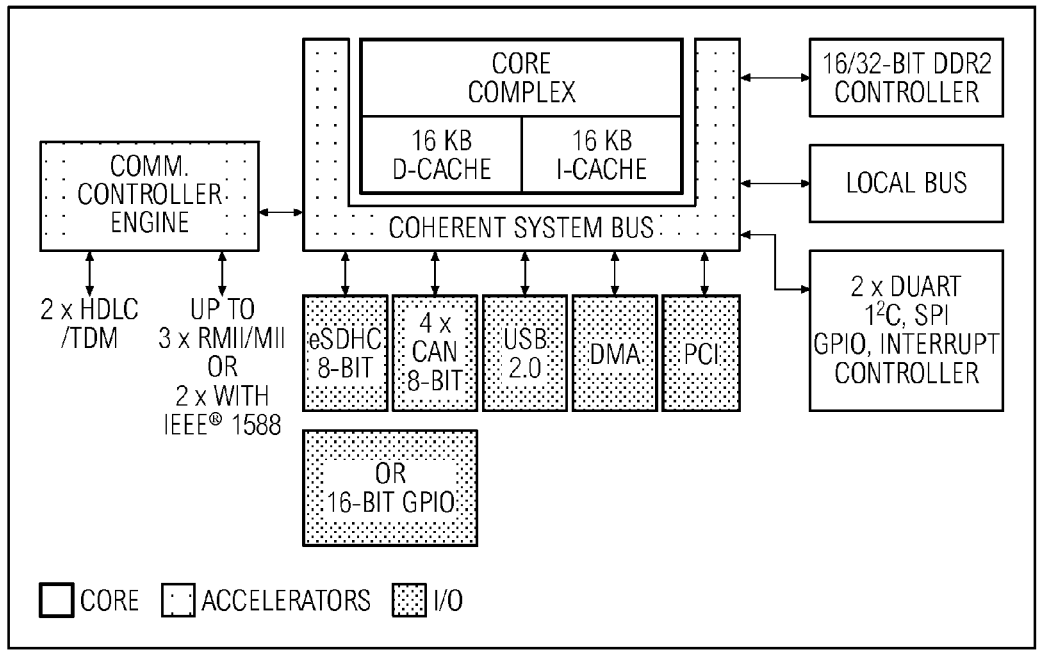
FIG. 6A is a schematic block diagram illustrating an embodiment of the invention in a first SOC.
Figure 6B:
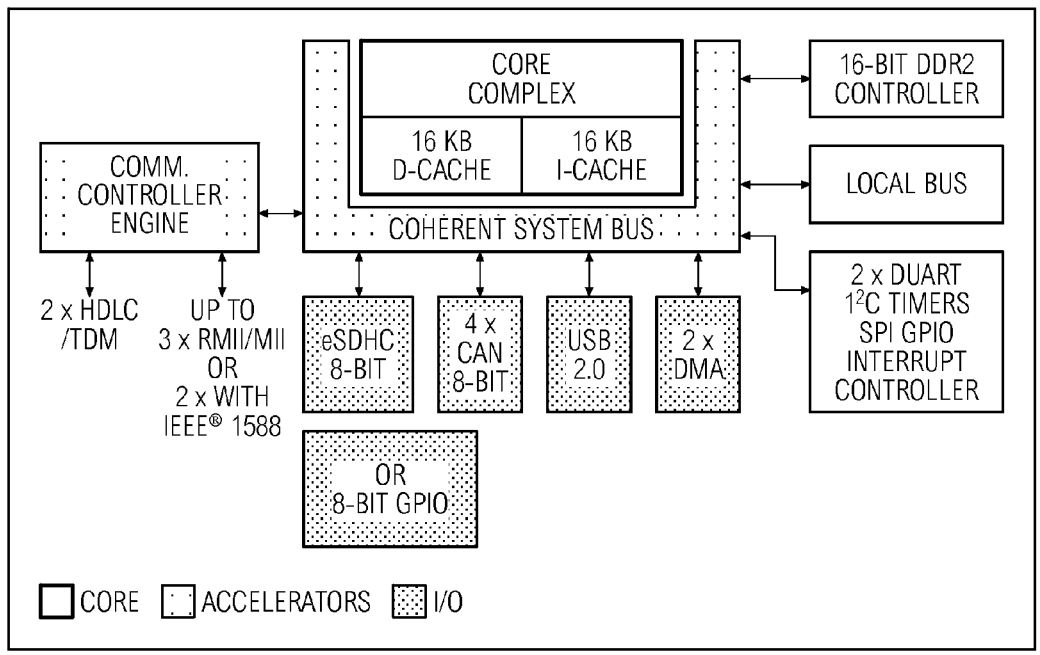
FIG. 6B is a schematic block diagram illustrating an embodiment of the invention in a second SOC.

FIGS. 6A and FIG. 6B illustrate another embodiment of the invention. As illustrated in FIG. 6A, a SOC is illustrated with a first personality of a superset die using, in this example, a 369 pin package, while in FIG. 6B, a second personality of the superset die is packaged in a 489 BGA package.

The interleaving and/or alternate multiplexing approaches described above provide for cost-effective solutions without compromising electrical performance whilst obviating any detrimental performance caused by wire sweep during the molding process. Customized solutions may be implemented for different target applications by enabling different packages with the same die.

Embodiments of the invention have broad reaching application and may be implemented in all wire bond products. Of course, the present invention also may be applied to flip-chip package types too.

Although the invention is described herein with reference to specific embodiments, various modifications and changes can be made without departing from the scope of the present invention as set forth in the claims below. For example, more than one physical interface may be used, where the physical interfaces may have different pad orders depending on the specific application. The physical interface may be, for example, a 32-bit or 64-bit DDR interface or, a UART or USB interface. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A system on chip (SOC) configurable for operation in at least one of a first personality and a second personality, the SOC comprising:
   a superset die configurable in both the first and second personalities;
   a first physical interface having a first set of interface pads and a second set of interface pads, wherein interface pads from the first set of interface pads are interleaved with interface pads from the second set of interface pads, and
   wherein the first set of interface pads are required for operation of the SOC in both the first and second personalities, and the second set of interface pads are not used when the SOC is configured for operation in the second personality, and
   wherein the interleaving of the first and second sets of interface pads eases interface pad signal routability and enhances device assembly.

2. The system on chip of claim 1, wherein the first set of interface pads comprises interface pads for a first byte lane and the second set of interface pads comprises interface pads for a second byte lane.

3. The system on chip of claim 2, wherein the first byte lane is from a first logical group of byte lanes and the second byte lane is from a second logical group of byte lanes.

4. The system on chip of claim 1, wherein an interface pad from the first set of interface pads is disposed between and adjacent to two interface pads from the second set of interface pads.

5. The system on chip of claim 4, wherein alternate interface pads of the first physical interface are from a particular byte lane.

6. The system on a chip of claim 1, further comprising:
   a second physical interface having a third set of interface pads, wherein the SOC is arranged for operation in the first personality using a first number of the third set of interface pads and for operation in the second personality using a second number of the third set of interface pads, the first number being greater than the second number; and
   a switch arranged to switch signals between the superset die and the second physical interface, and in the second personality, to switch signals to the second physical interface so that interface pads in the second number of interface pads are interleaved with interface pads not in use in the second personality.

7. A system on chip including a superset die configurable in both a first personality and a second personality, the system on chip comprising:
   a physical interface having interface pads, wherein the system on chip is arranged for operation in the first personality using a first number of the interface pads and for operation in the second personality using a second number of the interface pads, the first number being greater than the second number; and
   a switch arranged to switch signals between the superset die and the physical interface, and, in the second personality, to switch signals to the physical interface so that interface pads in the second number of interface pads are interleaved with interface pads not in use in the second personality.

8. The system on chip of claim 7, wherein an interface pad in the second number of interface pads is disposed between and adjacent to two interface pads not in use in the second personality.

9. The system on chip of claim 7, wherein the second number of the interface pads is a subset of the first number of the interface pads.

* * * * *